United States Patent
Davidovic et al.

(10) Patent No.: US 9,431,453 B2
(45) Date of Patent: Aug. 30, 2016

(54) FILL FACTOR OPTO-SENSITIVE DEVICE

(71) Applicant: Avago Technologies General IP (Singapore) Pte. Ltd., Singapore (SG)

(72) Inventors: Milos Davidovic, Vienna (AT); Wolfgang Gaberl, Vienna (AT); Robert Swoboda, Vienna (AT)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 282 days.

(21) Appl. No.: 14/060,837

(22) Filed: Oct. 23, 2013

(65) Prior Publication Data

US 2015/0108326 A1    Apr. 23, 2015

(51) Int. Cl.
*H01L 27/14* (2006.01)
*H01L 27/146* (2006.01)

(52) U.S. Cl.
CPC ... *H01L 27/14649* (2013.01); *H01L 27/14603* (2013.01); *H01L 27/14609* (2013.01); *H01L 27/14645* (2013.01)

(58) Field of Classification Search
CPC ........... H01L 27/14649; H01L 27/14603; H01L 27/14645; H01L 27/14605; G01J 1/42; G01J 1/0204; G01J 1/46
USPC ............ 250/214 R, 208.1, 214.1, 200; 257/290–292, 440
See application file for complete search history.

(56) References Cited

U.S. PATENT DOCUMENTS

| | | | | |
|---|---|---|---|---|
| 5,329,112 A | * | 7/1994 | Mihara | H01L 27/14665 250/208.1 |
| 5,349,174 A | * | 9/1994 | Van Berkel | H01L 27/12 250/208.1 |
| 7,153,720 B2 | | 12/2006 | Augusto | |
| 2001/0055829 A1 | * | 12/2001 | Bird | H01L 27/14643 438/48 |
| 2015/0079718 A1 | * | 3/2015 | Chen | H01L 27/14634 438/59 |

OTHER PUBLICATIONS

Bhaskaran et al., "Performance Based CID Imaging—Past, Present and Future", Thermo Fisher Scientific, 11 pages.
Titus et al., "CMOS Photodetectors", Photodiode—World Activities in 2011, available at http://www.intechopen.com/books/photodiodes-world-activities-in-2011/cmos-photodetectors, 2011, 37 pages.

* cited by examiner

*Primary Examiner* — Tony Ko (57) ABSTRACT

An opto-sensitive device, a pixel configured for use in an opto-sensitive device, and a method of operating an opto-sensitive device are disclosed. The opto-sensitive device illustratively includes a capacitor stacked on top of a photodetector, thereby improving the fill factor of the opto-sensitive device. Transparent properties of the capacitor for a wavelength of interest ensure that the incident light is completely or mostly absorbed only within the photodetector and not within the capacitor.

20 Claims, 5 Drawing Sheets

FILL FACTOR OPTO-SENSITIVE DEVICE

FIELD OF THE DISCLOSURE

The present disclosure is generally directed toward opto-electronic receivers.

BACKGROUND

Active pixel arrays normally consist of a photodetector which along with Metal-Oxide-Semiconductor Field-Effect Transistor (MOSFET) transistors, capacitors and, if need be, resistors form the opto-sensitive device. Most of the area of the pixel circuit is occupied by the photodetector and the capacitor, which serves to integrate the photo-generated current received from the photodetector. The integrated capacitors can consist of one or more detached plates with a dielectric disposed in between. Often times, the capacitor plates are in the Complementary Metal-Oxide-Semiconductor (CMOS) technology and manufactured from metal or polysilicon layers. Such structures are normally stacked up on a substrate.

For high capacitance requirements, a corresponding capacitor area is usually reserved on the substrate. In the case of active pixel-arrays, high capacitor area leads to a low fill factor and correspondingly large devices in each pixel. This can in turn not only increase the fabrication costs, but also limit the sensor properties, as the devices inside the pixel cannot be sized optimally. On the one hand, by reducing the size of the photodiode, the pixel sensitivity will be correspondingly reduced, as fewer photons are captured. On the other hand, by reducing the capacitor area, its capacitance will be accordingly lowered, limiting integration capabilities, which can subsequently dramatically increase the data evaluation efforts.

BRIEF DESCRIPTION OF THE DRAWINGS

The present disclosure is described in conjunction with the appended figures, which are not necessarily drawn to scale.

DETAILED DESCRIPTION

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Furthermore, various descriptive terms used herein, such as "transparent" should be given the broadest meaning possible within the context of the present disclosure. For example, something that is described as being "transparent" should be understood as having a property allowing no significant obstruction or absorption of electromagnetic radiation in the particular wavelength (or wavelengths) of interest, unless a particular transmittance is provided.

Possible applications of the disclosed opto-sensitive device or detector include receivers that require higher capacitance. For instance, it is often necessary to have a large feedback capacitor for the stabilization of a transimpedance amplifier. If the capacitor is located directly on top of a photodiode as disclosed herein, the active area needed for that capacitor can be reused or utilized for another purpose. As another possible field of application, the opto-sensitive device or detector described herein can be used in optical distance measurement sensors.

Figure 1:
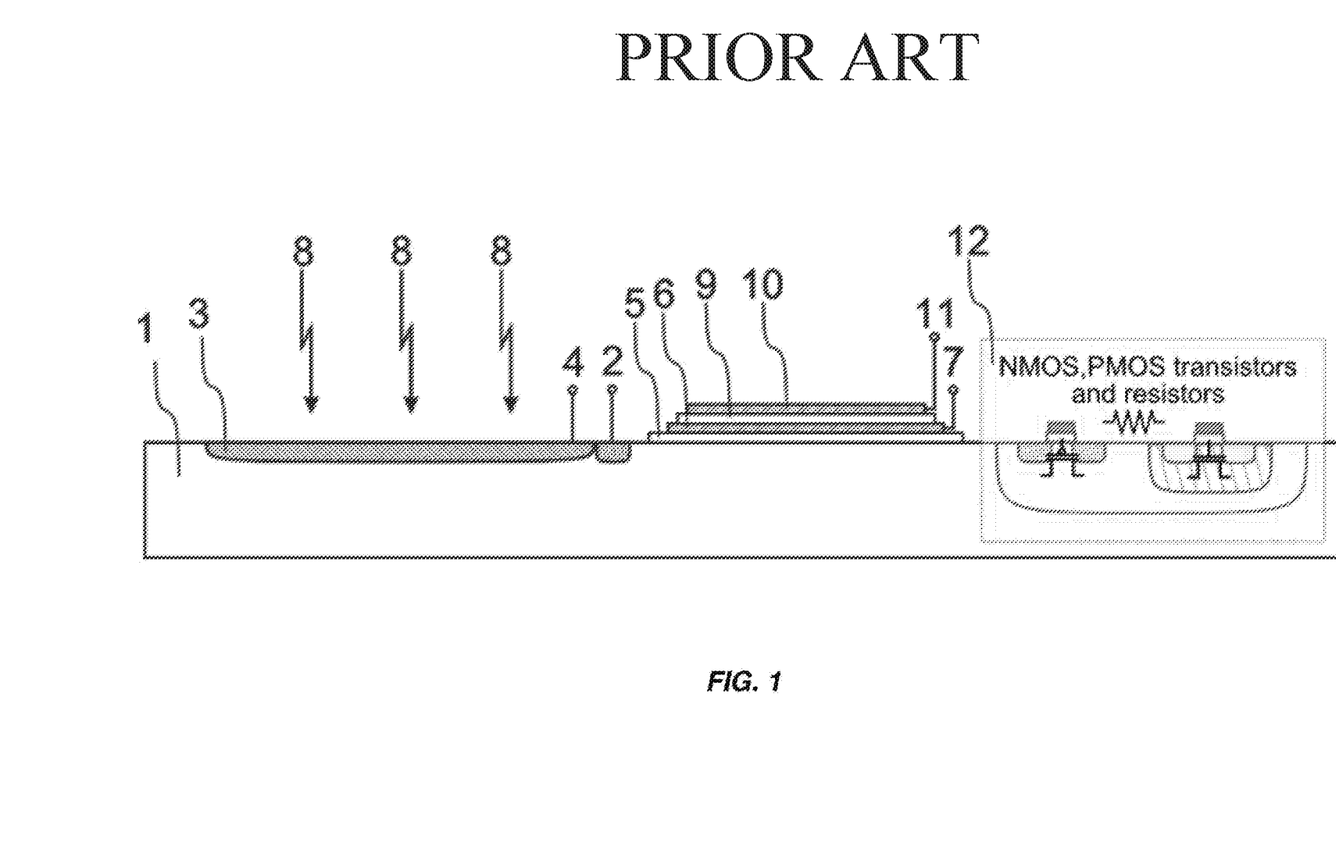
FIG. 1 depicts an opto-sensitive device according to embodiments of the prior art.

Embodiments of the present disclosure are intended to optimize the active area of an integrated optical receiver or active pixel with an integrated optical detector and capacitor in CMOS technology. In FIG. 1, a prior art implementation of an opto-sensitive device or detector is depicted. Specifically, the opto-sensitive device is depicted as including a photodetector configured to receive and convert incident light 8 into an electrical signal and a capacitor. In some embodiments, the components depicted in FIG. 1 may correspond to components of a single active pixel in an active pixel array.

In the depicted embodiment, the capacitor components (e.g., an isolation layer 5, first conducting layer 6, first capacitor contact 7, dielectric 9, second conducting layer 10, and second capacitor contact 11) are mounted on an area of the substrate 1 adjacent to the photodetector components (e.g., substrate 1, first electrical contact 2, second photodetector electrode 3, and second electrical contact 4). Thus, the incident light 8 reaches the photodetector components, specifically the substrate 1 and second photodetector electrode 3, without passing through any other component of the opto-sensitive device. The opto-sensitive device is also shown to include other electronics 12, which may include one or more of MOSFET transistors (e.g., NMOS transistors, PMOS transistors, etc.), resistors, inductors, and the like. In some embodiments, the photodetector components can consist of deep n or p-well. Likewise, the well formation of the other electronics 12 can include a deep n-well, depending upon the availability and/or circuit needs for the opto-sensitive device. The other electronics 12 may be mounted on the substrate 1 using surface-mount technologies, thru-hole mounting technologies, or the like.

The substrate 1 may comprise any type of material suitable to physically support the components mounted thereon. As an example, the substrate 1 may comprise n or p-type doped silicon with a heavily doped contact corresponding to the first electrical contact 2. The substrate 1 together with the first electrical contact 2 form one electrode for the photodetector. The second photodetector electrode 3 along with the second electrical contact 4 may define the active photo-sensitive area of the photodetector. In some embodiments, the second photodetector electrode 3 is inversely doped with respect to the substrate 1, which also functions as the first photodetector electrode. For instance, if the substrate 1 comprises n-type doped silicon, then the second photodetector electrode 3 may correspond to p-type doped silicon. Conversely, if the substrate 1 comprises p-type doped silicon, then the second photodetector electrode 3 may comprise n-type doped silicon.

In some embodiments, the incident light 8 is received at the second photodetector electrode 3 and due to the inverse doping between the second photodetector electrode 3 and substrate 1, electrons are released either by the doped region of the substrate 1 (e.g., first electrical contact 2) or the second photodetector electrode 3 via the second electrical contact 4. The electrons released by the electrode of the photodetector correspond to an electrical signal indicative of the received incident light 8. Once the electrons are released by the photodetector, the electrical signal is transmitted via the electrical contact 2 or 4 to the capacitor components. In particular, electrical signals transmitted via the electrical contact 2 or 4 may be received at one of the first capacitor contact 7 or second capacitor contact 11. Upon receiving the electrical signal, the capacitor components may integrate the received signal and then output the integrated signal via the contact 7 or 11 that did not receive the input from the electrical contact of the photodetector.

In the depicted embodiment of FIG. 1, the capacitor (e.g., the capacitor components) is located adjacent to the photodiode components. The capacitor components may include any type of silicon or metal-based structure. The isolation of the capacitor from the substrate 1 is managed with the isolation layer 5, which may be constructed in accordance with CMOS technology, generally formed of a silicon-dioxide material.

Figure 2:
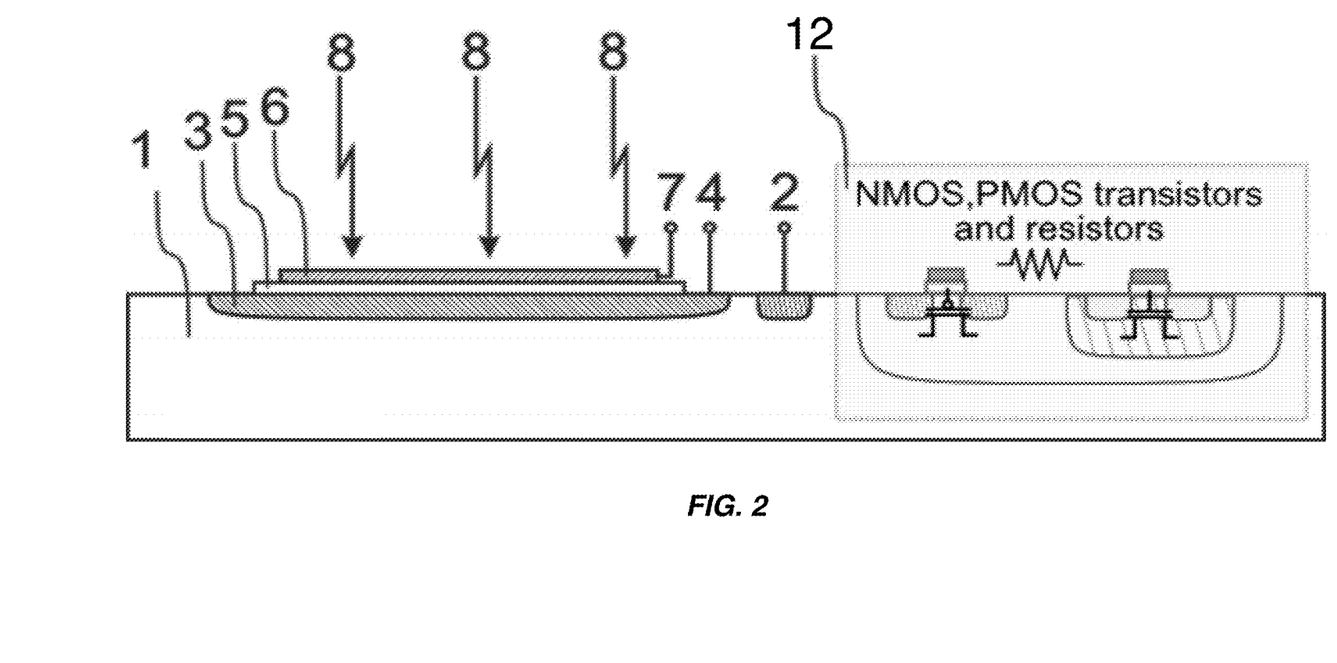
FIG. 2 depicts a first example of an opto-sensitive device according to embodiments of the present disclosure.
Figure 3:
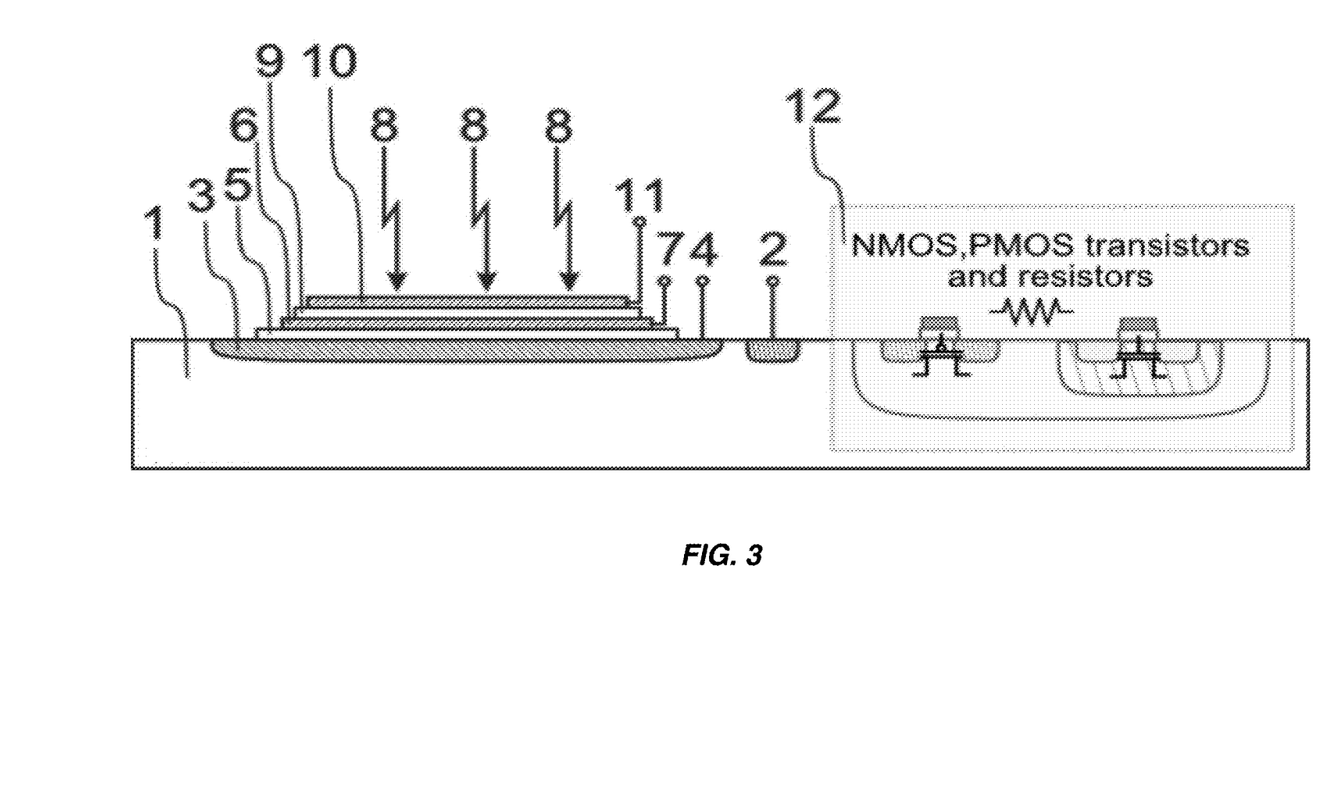
FIG. 3 depicts a second example of an opto-sensitive device according to embodiments of the present disclosure.
Figure 4:
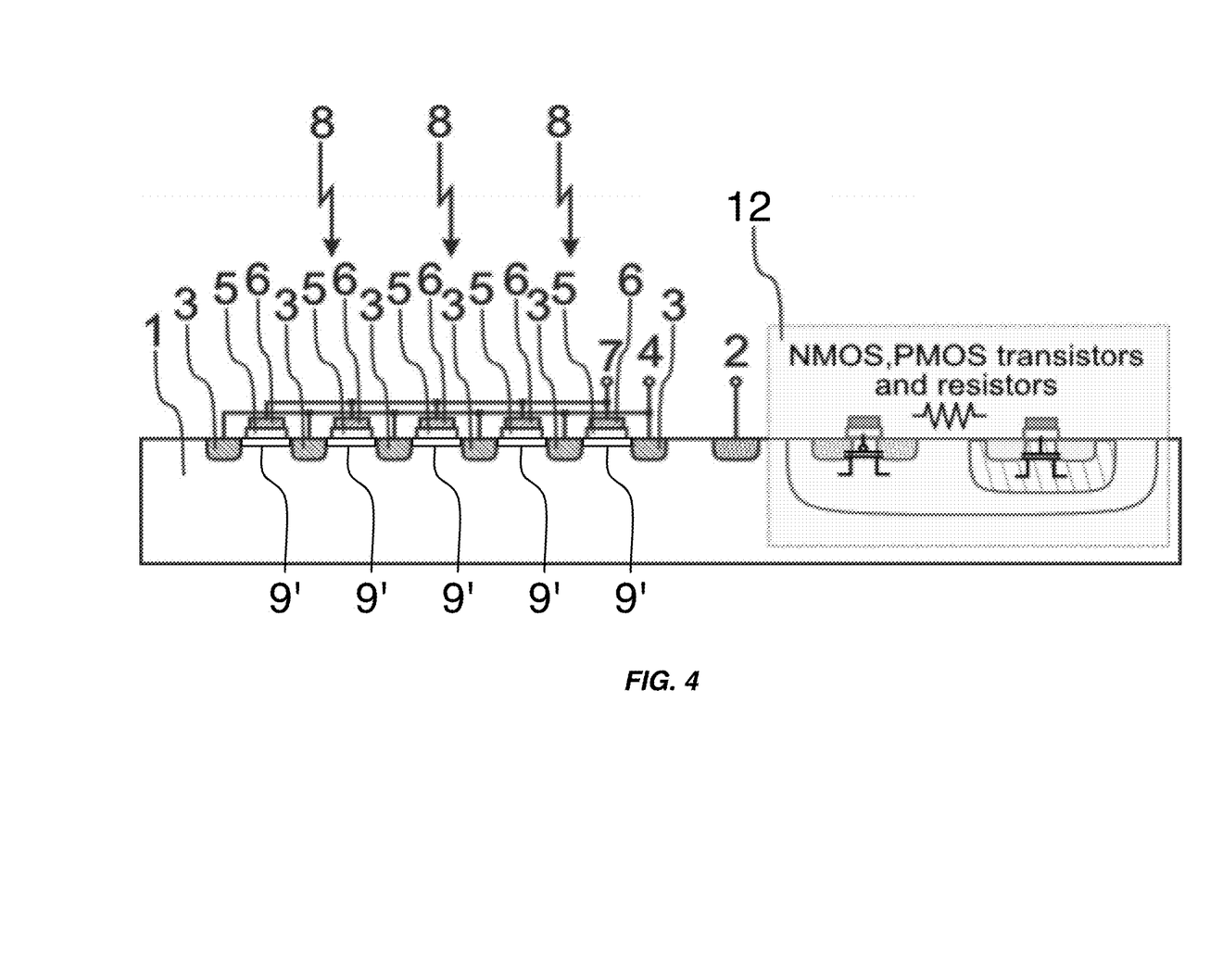
FIG. 4 depicts a third example of an opto-sensitive device according to embodiments of the present disclosure.

With reference now to FIGS. 2-4, various configurations of an opto-sensitive device will be described in accordance with at least some embodiments of the present disclosure. Each of the opto-sensitive devices achieves an improved fill factor by virtue of the fact that the capacitor (e.g., at least some capacitor components) are stacked upon the photodetector. In these embodiments, transparent properties of the capacitor components are used for a wavelength of interest so that the incident light 8 (e.g., an optical signal) is completely or mostly absorbed only with the photodetector 3 and not within the capacitor components. In accordance with at least some embodiments, the opto-sensitive devices disclosed herein are advantageously configured to detect modulated light of a predetermined wavelength or band of wavelengths. In the disclosed embodiments, a capacitor can be included in each pixel and, therefore, may be placed over the photodiode of each pixel.

Referring initially to FIG. 2, a first example of an opto-sensitive device is depicted in accordance with embodiments of the present disclosure. The opto-sensitive device exhibits the capacitor on top of the photodetector components. More specifically, the opto-sensitive device of FIG. 2 displays a three-electrode structure including a silicon substrate 1 that can be n or p-doped. The substrate 1 may further serve as one electrode of the photodetector. In some embodiments, the bottom photodetector electrode can be a buried well or a deep well, depending upon the process possibilities.

The second photodetector electrode 3 may be formed by inverse doping with respect to the substrate 1, which may correspond to the first photodetector electrode 3. In some embodiments, the second photodetector electrode 3 may be created by source/drain implantation, well implantation, deep well implantation, or any other process available in CMOS technologies. In other words, any type of CMOS technology may be used to establish the second photodetector electrode 3 in the substrate 1.

The doped substrate 1 and inversely-doped second photodetector electrode 3 together define a photodetector or optically-sensitive area, whereby low-ohmic contacts 2 and 4 define the connection points to the photodetector. In some embodiments, the contacts 2 and 4 are fabricated by a source/drain implantation as is well known in the CMOS arts.

In accordance with at least some embodiments, the second photodetector electrode 3 comprises is topped with a first conducting layer 6 and an isolation layer 5. In some embodiments, the first conducting layer 6 corresponds to a polysilicon layer and the isolation layer 5 correspond to a silicon-dioxide layer that serves to separate the polysilicon layer from the second photodetector electrode 3. In this particular configuration, the second photodetector electrode 3 serves a dual purpose in that it also acts as a plate for the capacitor. Accordingly, the capacitor components in the example of FIG. 2 include the second photodetector electrode 3, the isolation layer 5, and the first conducting layer 6. In some embodiments, the isolation layer 5 defines the dielectric properties of the capacitor and can be used to store the photogenerated charges of the photodetector. This also means that the second electrical contact 4 functions as a contact to the capacitor in addition to functioning as a contact to the photodetector.

In this particular configuration, incident light 8, or selected wavelengths thereof, pass through the first conducting layer 6 and the isolation layer 5 without substantially being absorbed. Instead, incident light 8, or selected wavelengths thereof, are absorbed between the second photodetector electrode 3 and substrate 1 and converted into an electrical signal that is output between the electrical contacts 2 and 4. By placing a dielectric (e.g., isolation layer 5) between the capacitor and photodetector, the area of the photodetector can be reused as the capacitor. Moreover, because both the first conducting layer 6 and isolation layer 5 are transparent at the wavelength of interest, the incident light 8 is allowed to pass therethrough and reach the photodetector (e.g., second photodetector electrode 3). In some embodiments, the wavelength of interest may correspond to infrared light or near-infrared light.

It should be noted that while the structure of FIG. 2 is depicted as comprising electrodes configured as solid planes, embodiments of the present disclosure are not so limited. Instead, the electrodes could be configured as finger structures. More specifically, the upper electrode of the photodetector and the bottom plate of the capacitor (e.g., second photodetector electrode 3) may be configured as two or more finger structures in the substrate 1 such that gaps between the fingers are filled with the material of substrate 1. It should also be noted as with the opto-sensitive device of FIG. 1, the opto-sensitive device of FIG. 2 may contain additional devices like MOSFET transistors and resistors 12, whereby the MOSFETs' bulk can include deep n-wells, normal wells or substrate, depending on the availability and/or circuit needs.

With reference now to FIG. 3, a second example of an opto-sensitive device is depicted in accordance with embodiments of the present disclosure. The opto-sensitive device exhibits the capacitor on top of the photodetector components as in FIG. 2. More specifically, the opto-sensitive device of FIG. 3 displays a four-pin structure whereby a polysilicon-polysilicon capacitor is electrically isolated from and formed on top of the photodetector components. It may be the situation that technology is limited and a good conductive photodiode electrode cannot be achieved with the configuration of FIG. 2. This could lead to non-linear behavior of the capacitor. In some applications, this non-linear behavior could create problems in the overall performance of the opto-sensitive device. Furthermore, there are also applications where the capacitor and the photodetector are not allowed to be directly connected. In such applications, the structure of FIG. 3 may be utilized whereby the bottom conductive plate of the capacitor (e.g., first conductive layer 6) has a parasitic capacitance. The capacitor can then be completed by stacking two or more layers thereon. For instance, a dielectric 9 may be stacked on top of the first conductive layer 6 and then a second conductive layer 10 may be stacked on top of the dielectric 9. The layers 6 and 10 may correspond to the plates of the capacitor and the dielectric 9 may separate the plates. In this particular configuration, the attenuation is not very strong due to the silicon absorption properties. This structure could also be used for infrared and near-infrared light detection.

As shown in FIG. 3, the structure comprises a silicon substrate 1, which can be either p or n-type doped. Again, the bottom photodetector electrode can be a buried well or a deep well, depending on the process possibilities. The first electrical contact 2 serves to contact the substrate 1 and to be, at the same time, and electrical output for the photodetector. By means of implantation, an inversely doped area in the form of a second photodetector electrode 3 may be arranged on the substrate 1. This second photodetector electrode 3 along with the second electrical contact 4 may form another electrode of the photodetector.

On top of the photodetector an isolation layer 5 may be provided. The isolation layer 5 in this particular configuration may comprise a silicon-dioxide, nitride, or oxynitride, which functions to electrically isolate the photodetector from the capacitor stacked thereon. In some embodiments, the first conducting layer 6 is provided on the isolation layer 5. The first conducting layer 6 may comprise a transparent polysilicon, which forms the bottom electrode of the capacitor.

A dielectric 9 may be formed on top of the first conducting layer 6 and then a second conducting layer 10 may be formed on the dielectric 9. In some embodiments, the dielectric 9 can be realized with silicon-dioxide, whereas the second conducting layer 10 can be of the same type as the first conducting layer 6 (e.g., any silicon or metal-based structure). In some embodiments, transparent materials are used for the isolation layer 5, first conducting layer 6, dielectric 9, and second conducting layer 10, thereby allowing the incident light 8, or selected wavelengths thereof, to pass through to the optically-sensitive area of the photodetector (e.g., second photodetector electrode 3). Due to the transparent nature of the capacitor components and isolation layer 5, the sensitivity of the opto-sensitive device is not compromised.

In this example as with the other examples described herein, additional devices 12 may be provided for a pixel. Additionally, as with FIG. 2, the second photodetector electrode 3 may comprise a finger structure where a plurality of fingers are established with channels or gaps therebetween.

In a normal CMOS process, the photodiode is usually masked out with a capacitor as shown in FIG. 2 or 3. It may be possible, however, to share space between a photodetector and capacitor without necessarily forming the capacitor entirely over the photodetector components. Instead, the photodetector components (e.g., second photodetector electrode 3) may be formed with finger structures and channels/gaps may be presented between each of the finger structures. As shown in FIG. 4, if a finger structure is used for the second photodetector electrode 3, it may be possible to not directly mask the photodetector with the capacitor components. Instead, the capacitor can be formed between the channels and the polysilicon layer.

More specifically, FIG. 4 depicts a third example of an opto-sensitive device in accordance with embodiments of the present disclosure. The structure of FIG. 4 shows a substrate 1, which may be n or p-type doped silicon and the first electrical contact 2 may define the first electrode for the photodetector. The substrate 1 and first electrical contact 2 may be the same or similar to the other substrates 1 and contacts 2 described herein.

The upper photodetector electrode (e.g., second photodetector electrode 3) may be inversely doped with respect to the substrate 1 and may comprise a plurality of fingers with channels therebetween. The channels or gaps between the inversely doped portions of the second photodetector electrode 3 may be doped like the rest of the substrate 1. In this particular configuration, the channels or gaps between the fingers of the second photodetector electrode 3 may have the capacitor components formed thereon. In the depicted embodiments, the MOSFET channels 9' may be established using any type of known CMOS process. The MOSFET channels 9' electrically connect the fingers of the second photodetector electrode 3 on the substrate 1.

More specifically, an isolation layer 5 may be deposited on the areas of the substrate 1 between the fingers of the second photodetector electrode 3. In some embodiments, the isolation layer 5 may comprise a silicon-dioxide or other gate-oxide material. The material of the isolation layer 5 may also function as the dielectric for the capacitor. On top of this isolation layer 5, a first conductive layer 6 for the capacitor is formed. The conductive layer 6 may comprise polysilicon and may function as the upper capacitor electrode. In some embodiments, the bottom plate of the capacitor is fully operational only when the channel beneath the poly-silicon plates is formed.

As with the other devices described herein, as long as the materials of the capacitor are transparent at the wavelength of interest, the MOSFET capacitors will not compromise the photodetector sensitivity. Also as with the other devices, the pixel may contain additional devices 12, such as MOSFET transistors, resistors, and the like, whereby the MOSFET's bulk can include deep n-wells, normal wells, or substrates, depending upon the availability and/or circuit needs.

Figure 5:
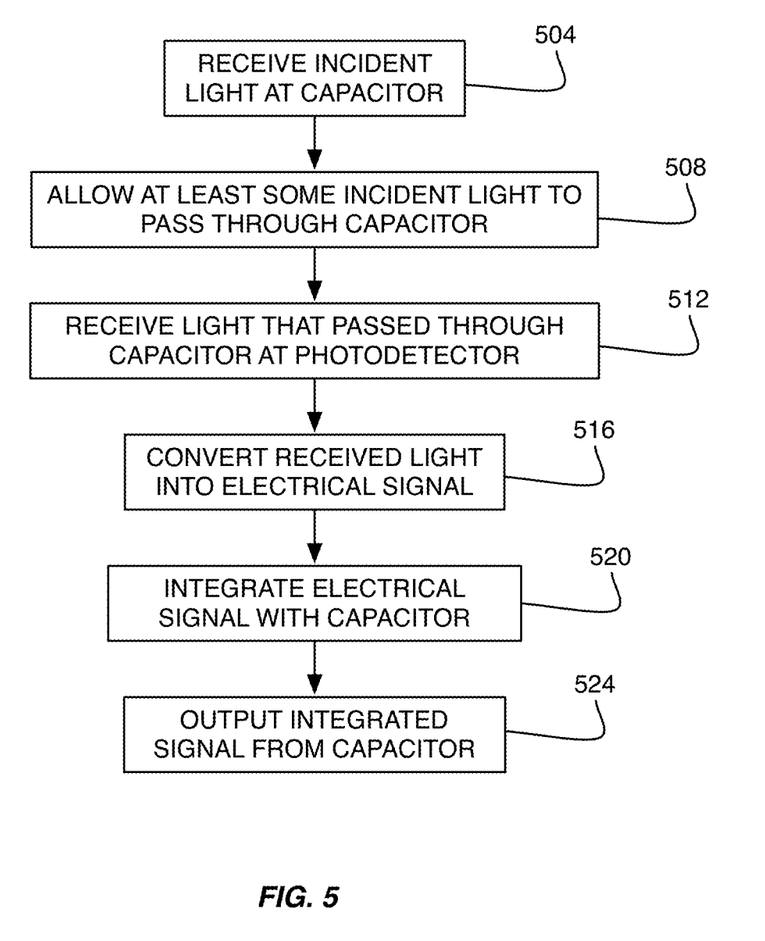
FIG. 5 is a flow diagram depicting a method of operating an opto-sensitive device according to embodiments of the present disclosure.

With reference now to FIG. 5, a method of operating an opto-sensitive device will be described in accordance with at least some embodiments of the present disclosure. The method begins by receiving incident light at a capacitor component of a pixel (step 504). In some embodiments, the capacitor component may be manufactured with CMOS technologies.

The method continues with the capacitor components allowing at least some of the incident light to pass through (step 508). Specifically, the capacitor may be transparent at a wavelength of band of wavelengths of interest. As an example, the capacitor may be transparent to infrared or near-infrared light having a wavelength between approximately 600 nm and 1.1 um.

The light that passes through the capacitor component(s) is then received at an optically-sensitive area of a photodetector (step 512). In some embodiments, the capacitor is formed directly on top of the photodetector components. In some embodiments, the capacitor is formed on the photodetector, but in channels between fingers of an electrode of the photodetector.

The light received at the photodetector is then converted into an electrical signal (step 516) and output via an electrical contact of the photodetector. The output of the photodetector is provided to the capacitor through which the incident light was allowed to pass so that the capacitor can integrate the signal (step 520). The integrated signal is then output from the capacitor and provided to some other circuitry, which may be within the same pixel as the capacitor or which may correspond to a microprocessor, ASIC, or the like (step 524). In some embodiments, the above-described method may be performed simultaneously by a plurality of pixels in an active pixel array and the outputs of each pixel may be provided to a microprocessor, ASIC, or the like.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An opto-sensitive device, comprising:
   a silicon substrate that is at least one of n and p-type doped, the silicon substrate corresponding to a first electrode of a photodetector;
   a second photodetector electrode established within the silicon substrate, wherein the second photodetector electrode is inversely doped with respect to the silicon substrate, wherein at least one of the first and second electrodes of the photodetector are capable of releasing electrons in response to receiving incident light of a predetermined wavelength;
   at least one photodetector electrical contact connected to at least one of the first electrode and second electrode of the photodetector, the at least one photodetector electrical contact being configured to carry the electrons released from the at least one of the first and second electrodes; and
   a capacitor positioned over the first electrode of the photodetector and the second electrode of the photodetector, wherein the capacitor is formed using Complementary Metal-Oxide-Semiconductor (CMOS) technologies, wherein the capacitor is at least partially transparent with respect to the predetermined wavelength, wherein the capacitor comprises a first capacitive plate and a dielectric positioned between the first capacitive plate and the second electrode of the photodetector, and wherein the first capacitive plate is included within the photodetector.

2. The opto-sensitive device of claim 1, wherein the capacitor is configured to integrate an electrical signal received from the photodetector via the at least one photodetector electrical contact.

3. The opto-sensitive device of claim 1, wherein the incident light is absorbed between the first and second electrodes of the photodetector after the incident light has passed through the capacitor.

4. The opto-sensitive device of claim 1, wherein the dielectric comprises silicon-dioxide, wherein the first capacitive plate comprises polysilicon, and wherein the second photodetector electrode also functions as a second capacitive plate for the capacitor.

5. The opto-sensitive device of claim 1, wherein the capacitor further comprises a second capacitive plate, and a dielectric positioned between the first capacitive plate and the second capacitive plate.

6. The opto-sensitive device of claim 5, wherein each of the first capacitive plate, the second capacitive plate, and the dielectric are provided on top of the second photodetector electrode and wherein an isolation layer is positioned between the first capacitive plate and the second photodetector electrode.

7. The opto-sensitive device of claim 6, wherein the isolation layer comprises at least one of silicon-dioxide, nitride, and oxynitride and wherein the isolation layer electrically isolates the second photodetector electrode from the first capacitive plate of the capacitor.

8. The opto-sensitive device of claim 1, further comprising at least one of a Metal-Oxide-Semiconductor Field-Effect Transistor (MOSFET) and resistor mounted on the substrate and adjacent to the second photodetector electrode.

9. The opto-sensitive device of claim 1, wherein the second photodetector electrode is configured with a plurality of finger structures with gaps therebetween.

10. The opto-sensitive device of claim 9, wherein the capacitor is positioned above the gaps.

11. The opto-sensitive device of claim 1, wherein the predetermined wavelength is between 600nm and 1.1 um.

12. A pixel configured for use in an opto-sensitive device, the pixel comprising:
a photodetector comprising:
a first electrode that is at least one of n and p-type doped silicon;
a second electrode that is inversely doped with respect to the first electrode, wherein at least one of the first and second electrodes of the photodetector are capable of releasing electrons in response to receiving incident light; and
a capacitor positioned over the first electrode of the photodetector and the second electrode of the photodetector, wherein the capacitor is formed using Complementary Metal-Oxide-Semiconductor (CMOS) technologies, wherein the capacitor comprises a first capacitive plate and a dielectric positioned between the first capacitive plate and the second photodetector electrode, wherein the first capacitive plate is included within the photodetector, and wherein the capacitor is at least partially transparent with respect to the incident light.

13. The pixel of claim 12, wherein at least one electrode of the capacitor is further connected to additional electronics and provides an electronic signal as an output to the additional electronics.

14. The pixel of claim 12, wherein the dielectric comprises silicon-dioxide, wherein the first capacitive plate comprises polysilicon, and wherein the second electrode of the photodetector also functions as a second capacitive plate for the capacitor.

15. The pixel of claim 12, wherein the capacitor further comprises a second capacitive plate, and a dielectric positioned between the first capacitive plate and the second capacitive plate, wherein each of the first capacitive plate, the second capacitive plate, and the dielectric are provided on top of the second electrode of the photodetector, and wherein an isolation layer is positioned between the first capacitive plate and the second electrode of the photodetector.

16. The pixel of claim 12, wherein the second electrode of the photodetector is configured with a plurality of finger structures with gaps therebetween.

17. The pixel of claim 16, wherein the capacitor is positioned above the gaps.

18. An active array of pixels comprising the pixel of claim 12.

19. A method of operating an opto-sensitive device manufactured with Complementary Metal-Oxide-Semiconductor (CMOS) technology, the method comprising:
receiving incident light at a capacitor comprising, a capacitive plate and a dielectric positioned between the capacitive plate and an electrode of a photodetector;
allowing at least some of the incident light received at the capacitor to pass through the capacitor;
receiving the incident light that has passed through the capacitor at the photodetector;
converting the incident light received at the photodetector into an electrical signal;
providing the electrical signal to the capacitor that received the incident light;
integrating the electrical signal with the capacitor that received the incident light; and
providing the integrated electrical signal as an output of the opto-sensitive device.

20. The method of claim 19, wherein at least one of the integrated electrical signal and the electrical signal are provided to a CMOS transistor that is established in a substrate also supporting the photodetector.

* * * * *